US012581943B2

(12) United States Patent
    Li

(10) Patent No.:    US 12,581,943 B2
(45) Date of Patent:     Mar. 17, 2026

(54) THREE-DIMENSIONAL (3D) METAL-INSULATOR-METAL CAPACITOR (MIMCAP) INCLUDING STACKED VERTICAL METAL STUDS FOR INCREASED CAPACITANCE DENSITY AND RELATED FABRICATION METHODS

(71) Applicant: QUALCOMM Incorporated, San Diego, CA (US)

(72) Inventor: Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 845 days.

(21) Appl. No.: 17/480,881

(22) Filed: Sep. 21, 2021

(65) Prior Publication Data

US 2023/0085846 A1     Mar. 23, 2023

(51) Int. Cl.
   *H01L 23/522*      (2006.01)
   *H01L 21/768*      (2006.01)
                (Continued)

(52) U.S. Cl.
   CPC .... *H01L 23/5223* (2013.01); *H01L 21/76816* (2013.01); *H01L 21/76831* (2013.01);
                (Continued)

(58) Field of Classification Search
   CPC ........... H01L 23/5223; H01L 21/76816; H01L 21/76831; H01L 21/76832;
                (Continued)

(56) References Cited

U.S. PATENT DOCUMENTS 11,322,499 B2 *  5/2022  Cho ....................... H10D 1/716
2012/0153434 A1  6/2012  Abou-Khalil et al.
                (Continued)

FOREIGN PATENT DOCUMENTS

TW      201707054 A    2/2017

OTHER PUBLICATIONS

Capraro, S. et al., "Design Improvement of Rf 3D Mim Damascene Capacitor," Simulation Standard, vol. 18, No. 3, Jul./Aug./Sep. 2008, IEEE, 5 pages.

(Continued)

*Primary Examiner* — Zandra V Smith
*Assistant Examiner* — John M Parker
(74) *Attorney, Agent, or Firm* — W&T

(57) ABSTRACT

A three-dimensional (3D) metal-insulator-metal capacitor (MIMCAP) includes a plurality of center studs disposed within cavity walls of a plurality of cavities in a top plate. The center studs and the cavity walls are oriented orthogonal to a first metal layer and extend through a first via layer and a second metal layer. Each center stud includes a metal layer stud in the second metal layer stacked on a via layer stud in the first via layer. A dielectric layer is disposed between the center studs and the cavity walls of the plurality of cavities in the top plate. The center studs are coupled to a first electrode, and the top plate is coupled to a second electrode in the interconnect layers. In some examples, the center studs can form vertically oriented cylindrical capacitive elements positioned for high capacitance density.

20 Claims, 13 Drawing Sheets

(51) Int. Cl.

| | |
|---|---|
| *H01L 23/528* | (2006.01) |
| *H01L 23/66* | (2006.01) |
| *H10D 1/00* | (2025.01) |
| *H10D 1/68* | (2025.01) |

(52) U.S. Cl.
CPC .. *H01L 21/76832* (2013.01); *H01L 21/76846* (2013.01); *H01L 21/76871* (2013.01); *H01L 23/5226* (2013.01); *H01L 23/5283* (2013.01); *H01L 23/66* (2013.01); *H10D 1/042* (2025.01); *H10D 1/043* (2025.01); *H10D 1/716* (2025.01); *H01L 2223/6616* (2013.01); *H01L 2223/6672* (2013.01)

(58) Field of Classification Search
CPC ......... H01L 21/76846; H01L 21/76871; H01L 21/76898; H01L 28/40; H01L 28/90; H01L 28/91
See application file for complete search history.

(56) References Cited

U.S. PATENT DOCUMENTS

| | | | |
|---|---|---|---|
| 2016/0268144 A1 | 9/2016 | Voiron et al. | |
| 2017/0062435 A1 | 3/2017 | Im et al. | |
| 2019/0035743 A1* | 1/2019 | Chang | H01L 23/544 |
| 2020/0161235 A1 | 5/2020 | Kwon et al. | |
| 2021/0175323 A1 | 6/2021 | Singh et al. | |
| 2021/0296322 A1* | 9/2021 | Lee | H01L 28/90 |
| 2022/0149149 A1* | 5/2022 | Huang | H01L 28/92 |

OTHER PUBLICATIONS

Lin, H. et al., "91.5%-Efficiency Fully Integrated Voltage Regulator with 86fF/$\mu m^2$-High-Density 2.5D MIM Capacitor," 2021 Symposium on VLSI Technology, Jun. 13-19, 2021, Kyoto, Japan, IEEE, 2 pages.

International Search Report and Written Opinion for International Patent Application No. PCT/US2022/074754, mailed Dec. 15, 2022, 13 pages.

Search Report for Taiwan Patent Application No. 111129779, mailed Nov. 10, 2025, 1 page.

* cited by examiner

300

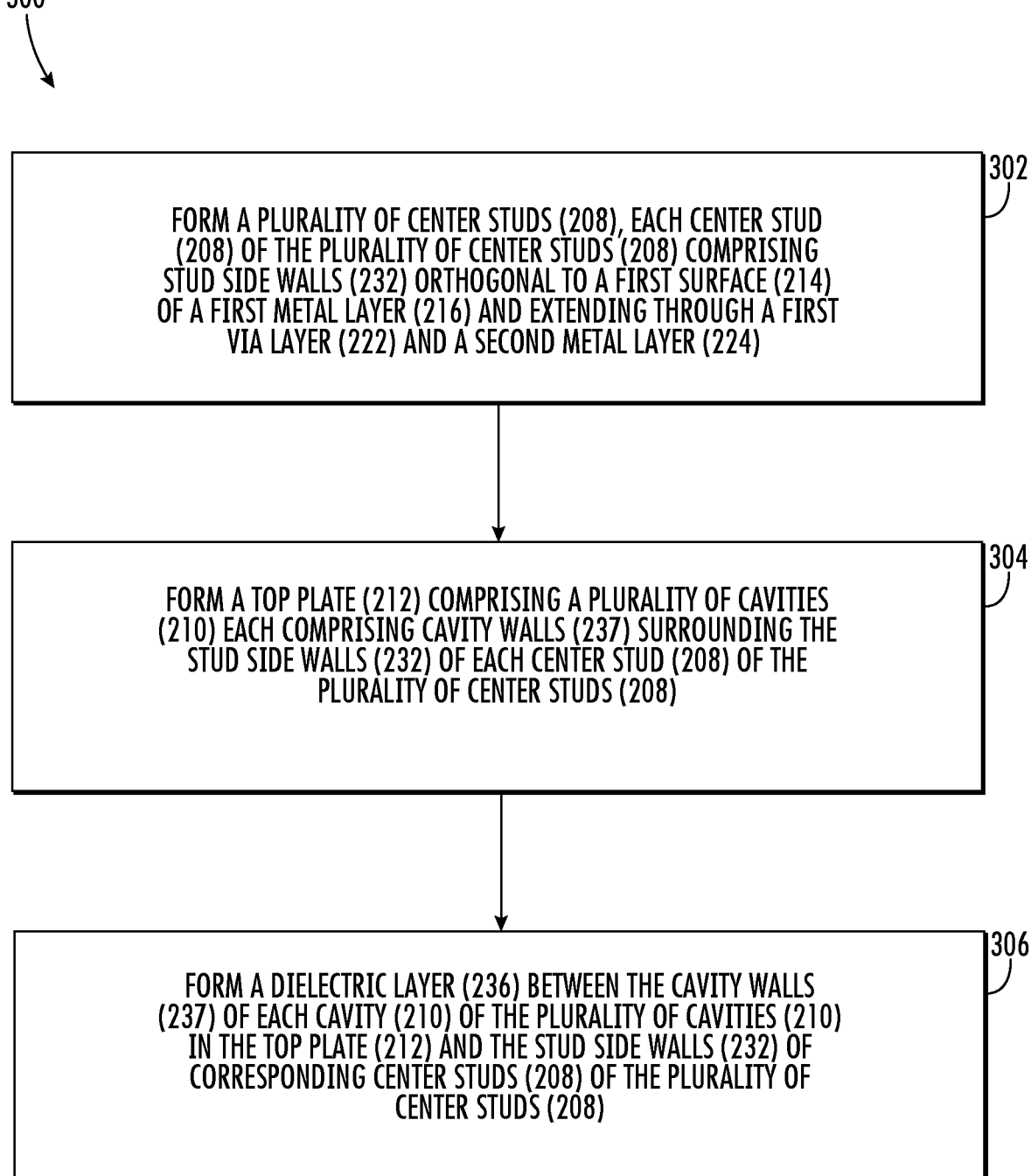

302

FORM A PLURALITY OF CENTER STUDS (208), EACH CENTER STUD (208) OF THE PLURALITY OF CENTER STUDS (208) COMPRISING STUD SIDE WALLS (232) ORTHOGONAL TO A FIRST SURFACE (214) OF A FIRST METAL LAYER (216) AND EXTENDING THROUGH A FIRST VIA LAYER (222) AND A SECOND METAL LAYER (224)

304

FORM A TOP PLATE (212) COMPRISING A PLURALITY OF CAVITIES (210) EACH COMPRISING CAVITY WALLS (237) SURROUNDING THE STUD SIDE WALLS (232) OF EACH CENTER STUD (208) OF THE PLURALITY OF CENTER STUDS (208)

306

FORM A DIELECTRIC LAYER (236) BETWEEN THE CAVITY WALLS (237) OF EACH CAVITY (210) OF THE PLURALITY OF CAVITIES (210) IN THE TOP PLATE (212) AND THE STUD SIDE WALLS (232) OF CORRESPONDING CENTER STUDS (208) OF THE PLURALITY OF CENTER STUDS (208)

FIG. 3

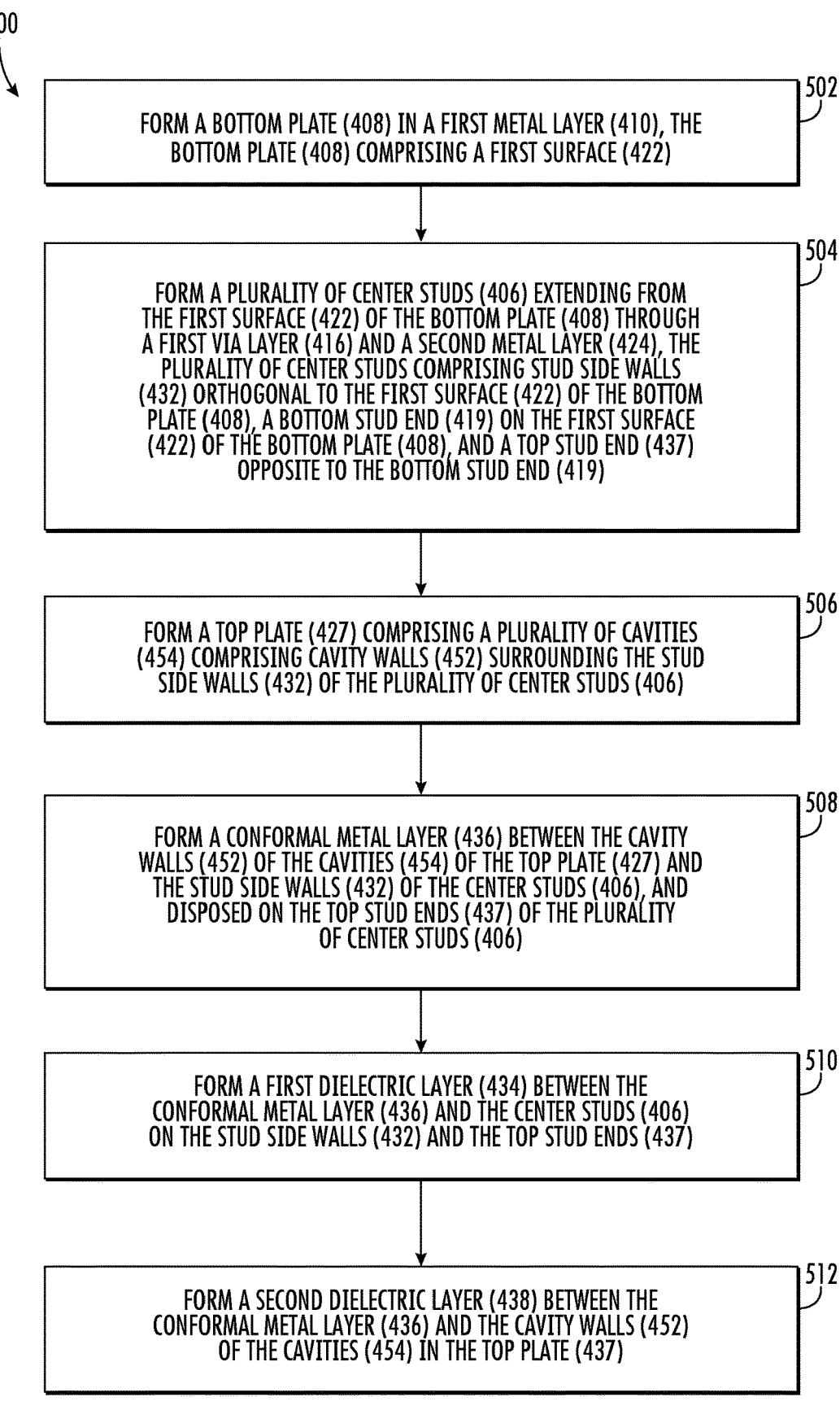

500

502
FORM A BOTTOM PLATE (408) IN A FIRST METAL LAYER (410), THE BOTTOM PLATE (408) COMPRISING A FIRST SURFACE (422)

504
FORM A PLURALITY OF CENTER STUDS (406) EXTENDING FROM THE FIRST SURFACE (422) OF THE BOTTOM PLATE (408) THROUGH A FIRST VIA LAYER (416) AND A SECOND METAL LAYER (424), THE PLURALITY OF CENTER STUDS COMPRISING STUD SIDE WALLS (432) ORTHOGONAL TO THE FIRST SURFACE (422) OF THE BOTTOM PLATE (408), A BOTTOM STUD END (419) ON THE FIRST SURFACE (422) OF THE BOTTOM PLATE (408), AND A TOP STUD END (437) OPPOSITE TO THE BOTTOM STUD END (419)

506
FORM A TOP PLATE (427) COMPRISING A PLURALITY OF CAVITIES (454) COMPRISING CAVITY WALLS (452) SURROUNDING THE STUD SIDE WALLS (432) OF THE PLURALITY OF CENTER STUDS (406)

508
FORM A CONFORMAL METAL LAYER (436) BETWEEN THE CAVITY WALLS (452) OF THE CAVITIES (454) OF THE TOP PLATE (427) AND THE STUD SIDE WALLS (432) OF THE CENTER STUDS (406), AND DISPOSED ON THE TOP STUD ENDS (437) OF THE PLURALITY OF CENTER STUDS (406)

510
FORM A FIRST DIELECTRIC LAYER (434) BETWEEN THE CONFORMAL METAL LAYER (436) AND THE CENTER STUDS (406) ON THE STUD SIDE WALLS (432) AND THE TOP STUD ENDS (437)

512
FORM A SECOND DIELECTRIC LAYER (438) BETWEEN THE CONFORMAL METAL LAYER (436) AND THE CAVITY WALLS (452) OF THE CAVITIES (454) IN THE TOP PLATE (437)

IMD$_{X-1}$

702

800

FORM THE BOTTOM PLATE (702) IN THE FIRST METAL LAYER (704) AND DEPOSIT THE DIFFUSION BARRIER (712) ON THE FIRST SURFACE (714) OF THE FIRST METAL LAYER (704).          802

DEPOSIT THE ETCH STOP LAYER (716) ON THE
DIFFUSION BARRIER (712), AND PATTERN THE ETCH
STOP LAYER (716) TO CREATE THE OPENINGS (718)
FOR THE BOTTOM STUD ENDS.

804

800

FORM THE IMD LAYER IMD$_X$, TRENCH THE IMD LAYER IMD$_X$ TO THE OPENINGS (718), FORM THE BARRIER METAL (736) ON THE IMD LAYER IMD$_X$ IN THE TRENCHES (724), FORM THE SEED LAYER (738) ON THE BARRIER METAL (736), AND FORM CENTER STUDS (728) ON THE SEED LAYER (738) IN THE TRENCHES (724).

806

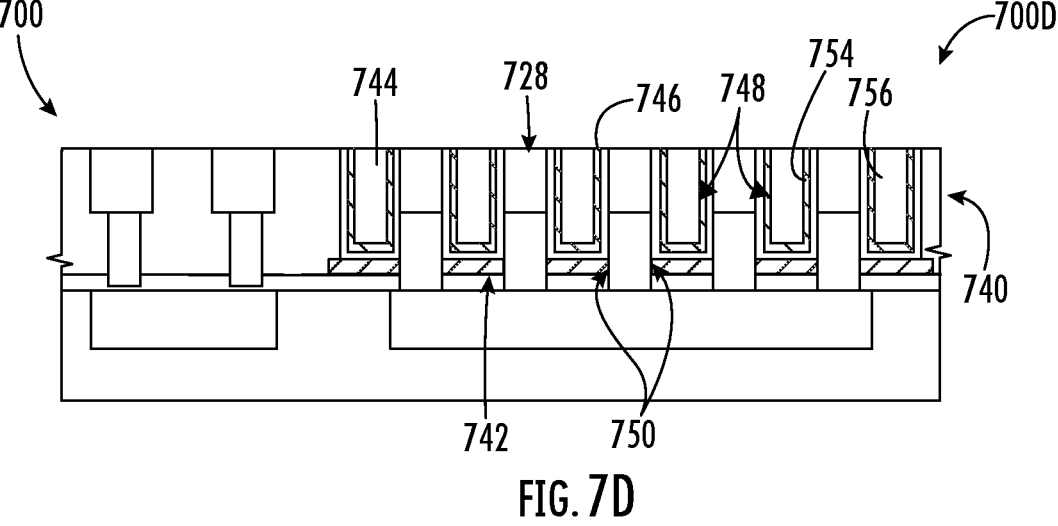

FIG. 7D

ETCH THE IMD LAYER IMD$_X$ IN THE FIRST VIA LAYER (720) AND THE SECOND METAL LAYER (722), DEPOSIT THE BARRIER METAL (752) ON THE STUD SIDE WALLS (750) OF THE CENTER STUDS (728), FORM THE DIELECTRIC LAYER (746) ON THE BARRIER METAL (752), FORM THE BARRIER METAL (754) ON THE DIELECTRIC LAYER (742, DEPOSIT THE SEED LAYER (756) ON THE BARRIER METAL (754), FORMING THE METAL (744) OF THE TOP PLATE (740) BETWEEN THE CENTER STUDS (728), AND CMP THE IMD LAYER IMD$_X$.

DEPOSIT A DIFFUSION BARRIER (760) AND DEPOSITING THE IMD LAYER $IMD_{X+1}$, ETCH THE IMD LAYER $IMD_{X+1}$ FOR THE VIAS 766 AND FOR THE METAL INTERCONNECT (768), DEPOSIT BARRIER METAL (770) ON THE IMD LAYER $IMD_{X+1}$, DEPOSIT METAL (772) TO FORM THE VIAS (766) AND THE METAL INTERCONNECT (768), AND DEPOSIT A TOP DIFFUSION BARRIER (774)

810

THREE-DIMENSIONAL (3D) METAL-INSULATOR-METAL CAPACITOR (MIMCAP) INCLUDING STACKED VERTICAL METAL STUDS FOR INCREASED CAPACITANCE DENSITY AND RELATED FABRICATION METHODS

BACKGROUND

I. Field of the Disclosure

The field of the disclosure relates to capacitors formed on integrated circuits, and in particular to metal-insulator-metal (MIM) capacitors (MIMCAPS) formed in a back-end-of-line (BEOL) process.

II. Background

Capacitors are an important component of radio frequency and analog circuits. Parallel plate capacitors, known as MIMCAPs, can be formed on integrated circuits (ICs) in front-end-of-line (FEOL) processes and BEOL processes. Capacitance between metal plates can be increased by reducing a distance between the plates and by increasing the dielectric constant (k) of a dielectric layer between the metal plates, but both of those methods depend on development of improved dielectric materials that can increase permittivity while also avoiding leakage currents that can pass from plate to plate through the dielectric material. A third method for increasing plate capacitance is to increase the surface area of the plates. To increase the surface area of the plates without increasing the die area (e.g., horizontal area) of an integrated circuit, IC designers have explored techniques for forming capacitors with surfaces of metal plates that extend orthogonal to (e.g., vertically) a surface of the semiconductor die. FEOL processes for developing MIMCAPs include, for example, forming metal plates for capacitors on side walls of trenches in a semiconductor die, but this approach occupies a precious area of the semiconductor die surface that could be used for active (transistor) circuits while there is a constant desire to minimize die size. Processes for forming MIMCAPs in the semiconductor die also face challenges as trench depth is increased to increase capacitor surface area. BEOL processes include forming MIMCAPs with horizontal plates in the metal interconnect layers of an integrated circuit. While such MIMCAPs avoid occupying semiconductor die surface area, the area occupied by the metal plates cannot be used for vertical interconnect accesses (vias). In addition, horizontal metal interconnects on the same metal layers as the MIMCAPS must be routed around the MIMCAPs, which increases routing congestion and increases the lengths of metal traces. Further, increasing the area of the MIMCAP to increase capacitance exacerbates the routing problem. One BEOL process is similar to the FEOL process described above, wherein trenches are created in the interlayer dielectric between metal routing layers. Further improvements in BEOL MIMCAP technology are needed to improve capacitance density in ICs.

SUMMARY OF THE DISCLOSURE

Exemplary aspects disclosed in the detailed description include three-dimensional (3D) metal-insulator-metal (MIM) capacitors (MIMCAPs), including vertically stacked metal studs for increased capacitance density. Related methods of fabricating 3D MIMCAPs are also disclosed. MIMCAPs are important components in radio frequency (RF) and analog circuits. During back-end-of-line (BEOL) processing of an integrated circuit (IC), MIMCAPS can be formed in the interconnect layers, which include via layers interleaved with metal layers on a semiconductor die. A MIMCAP includes parallel metal plates separated by a thin dielectric layer, and the capacitance provided by a MIMCAP increases with the area of the parallel metal plates. To reduce the area occupied by a MIMCAP in the interconnect layers, at least some of the metal plates of the MIMCAP are oriented orthogonal to the semiconductor surface (e.g., vertical), and a high capacitance density can be achieved by closely spacing the orthogonally oriented metal plates. In an exemplary aspect, a 3D MIMCAP includes a plurality of center studs disposed within cavity walls of cavities in a top plate. The center studs and cavity walls are oriented orthogonal to a first metal layer and extend through a first via layer and a second metal layer. Each center stud includes a metal layer stud in the second metal layer stacked on a via layer stud in the first via layer. A dielectric layer is disposed between the stud side walls and the cavity walls of the cavities in the top plate. The plurality of center studs are coupled to a first electrode, and the top plate is coupled to a second electrode to form a MIMCAP having a high capacitance density in the interconnect layers. In some examples, the center studs and cavity walls form vertically oriented cylindrical capacitive elements positioned for high capacitance density. In such examples, the center studs are solid metal cylindrical elements, and the cavity walls of the cavities in the top plate form metal cylinders concentric with the center studs. In some examples, a three-electrode capacitor includes a conformal metal layer between the cavity walls of the cavities and the stud side walls of the center studs such that the conformal metal layer can be a third electrode. The three-electrode capacitor includes a dielectric layer between the conformal metal layer and the cavity walls and another dielectric layer between the conformal metal layer and the stud side walls. In some examples, first cylindrical capacitive elements are formed in a first via layer and a second metal layer, and second cylindrical capacitive elements are formed in a second via layer and a third metal layer stacked on the first cylindrical capacitive elements for increased capacitance density.

In a first exemplary aspect, a 3D MIMCAP is disclosed. The 3D MIMCAP comprises a plurality of center studs, each center stud of the plurality of center studs comprising stud side walls orthogonal to a first surface of a first metal layer and extending through a first via layer and a second metal layer. The 3D MIMCAP comprises a top plate comprising a plurality of cavities, each cavity of the plurality of cavities comprising cavity walls surrounding the stud side walls of each center stud of the plurality of center studs. The 3D MIMCAP further comprises a dielectric layer disposed between the cavity walls of each cavity of the plurality of cavities of the top plate and the stud side walls of a corresponding center stud of the plurality of center studs.

In another exemplary aspect, a method of fabricating a 3D MIMCAP is disclosed. The method comprises forming a plurality of center studs, each center stud of the plurality of center studs comprising stud side walls orthogonal to a first surface of a first metal layer and extending through a first via layer and a second metal layer. The method comprises forming a top plate comprising a plurality of cavities, each cavity of the plurality of cavities comprising cavity walls surrounding the stud side walls of each center stud of the plurality of center studs. The method further comprises forming a dielectric layer between the cavity walls of each cavity of the plurality of cavities of the top plate and the stud side walls of a corresponding center stud of the plurality of center studs.

In another exemplary aspect, a 3D MIMCAP is disclosed. The 3D MIMCAP comprises a bottom plate in a first metal layer, the bottom plate comprising a first surface. The 3D MIMCAP comprises a plurality of center studs extending from the first surface of the bottom plate through a first via layer and a second metal layer. The plurality of center studs comprises stud side walls orthogonal to the first surface of the bottom plate, bottom stud ends on the first surface of the bottom plate, and top stud ends opposite to the bottom stud ends. The 3D MIMCAP comprises a top plate comprising a plurality of cavities comprising cavity walls surrounding the stud side walls of the plurality of center studs. The 3D MIMCAP comprises a conformal metal layer between the cavity walls of the plurality of cavities of the top plate and the stud side walls of the plurality of center studs and disposed on the top stud ends of the plurality of center studs. The 3D MIMCAP comprises a first dielectric layer disposed between the conformal metal layer and the plurality of center studs on the stud side walls and the top stud ends, and a second dielectric layer disposed between the conformal metal layer and the top plate.

In another exemplary aspect, a method of fabricating a 3D MIMCAP is disclosed. The method comprises forming a bottom plate in a first metal layer, the bottom plate comprising a first surface. The method comprises forming a plurality of center studs extending from the first surface of the bottom plate through a first via layer and a second metal layer, the plurality of center studs comprising stud side walls orthogonal to the first surface of the bottom plate, bottom stud ends on the first surface of the bottom plate, and top stud ends opposite to the bottom stud ends. The method comprises forming a top plate comprising a plurality of cavities comprising cavity walls surrounding the stud side walls of the plurality of center studs. The method comprises forming a conformal metal layer between the cavity walls of the plurality of cavities of the top plate and the stud side walls of the plurality of center studs and disposed on the top stud ends of the plurality of center studs. The method comprises forming a first dielectric layer between the conformal metal layer and the plurality of center studs on the stud side walls, and the top stud ends and forming a second dielectric layer between the conformal metal layer and the top plate.

BRIEF DESCRIPTION OF THE FIGURES

FIG. 3 is a flow chart of a process of fabricating a MIMCAP formed of center studs disposed in a plurality of cavities of a top plate, in the example in FIG. 2;

FIG. 5 is a flow chart of a process of fabricating a MIMCAP formed of center studs disposed in a plurality of cavities of a top plate, in the example in FIG. 2;

FIGS. 7A-7E are cross-sectional side views illustrating a MIMCAP as shown in FIG. 2 in stages of a fabrication process;

FIGS. 8A-8E are a flow chart of a process of fabricating a MIMCAP, including the stages shown in FIGS. 7A-7E.

DETAILED DESCRIPTION

Figure 1:
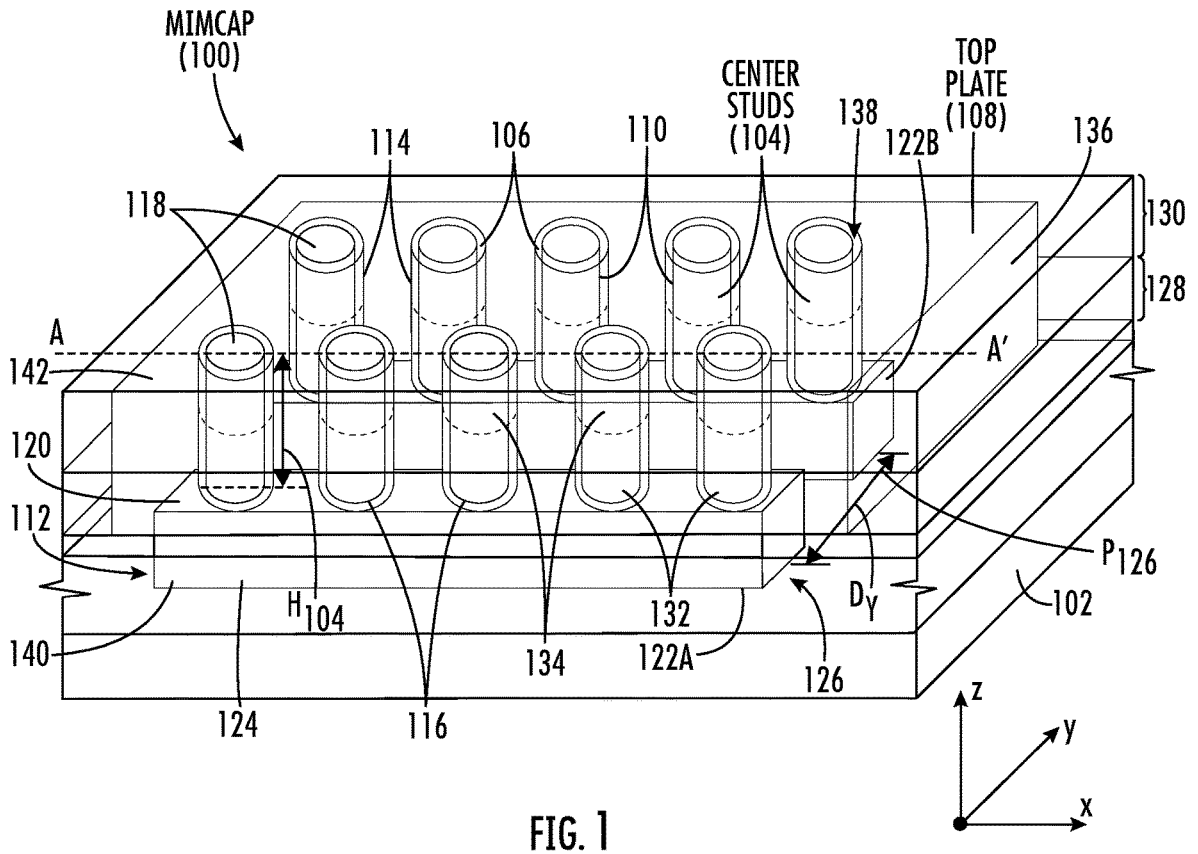
FIG. 1 is an illustration of a perspective view of a three-dimensional (3D) metal-insulator-metal (MIM) capacitor (MIMCAP) including a plurality of vertically oriented center studs disposed in a plurality of cavities in a top plate to provide high-density capacitance.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Exemplary aspects disclosed in the detailed description include three-dimensional (3D) metal-insulator-metal (MIM) capacitors (MIMCAPs), including vertically stacked metal studs for increased capacitance density. Related methods of fabricating 3D MIMCAPs are also disclosed. MIMCAPs are important components in radio frequency (RF) and analog circuits. During back-end-of-line (BEOL) processing of an integrated circuit (IC), MIMCAPS can be formed in the interconnect layers, which include via layers interleaved with metal layers on a semiconductor die. A MIMCAP includes parallel metal plates separated by a thin dielectric layer, and the capacitance provided by a MIMCAP increases with the area of the parallel metal plates. To reduce the area occupied by a MIMCAP in the interconnect layers, at least some of the metal plates of the MIMCAP are oriented orthogonal to the semiconductor surface (e.g., vertical), and a high capacitance density can be achieved by closely spacing the orthogonally oriented metal plates. In an exemplary aspect, a 3D MIMCAP includes a plurality of center studs disposed within cavity walls of cavities in a top plate. The center studs and cavity walls are oriented orthogonal to a first metal layer and extend through a first via layer and a second metal layer. Each center stud includes a metal layer stud in the second metal layer stacked on a via layer stud in the first via layer. A dielectric layer is disposed between the stud side walls and the cavity walls of the cavities in the top plate. The plurality of center studs are coupled to a first electrode, and the top plate is coupled to a second electrode to form a MIMCAP having a high capacitance density in the interconnect layers. In some examples, the center studs and cavity walls form vertically oriented cylindrical capacitive elements positioned for high capacitance density. In such examples, the center studs are solid metal cylindrical elements, and the cavity walls of the cavities in the top plate form metal cylinders concentric with the center studs. In some examples, a three-electrode capacitor includes a conformal metal layer between the cavity walls of the cavities and the stud side walls of the center studs such that the conformal metal layer can be a third electrode. The three-electrode capacitor includes a dielectric layer between the conformal metal layer and the cavity walls and another dielectric layer between the conformal metal layer and the stud side walls. In some examples, first cylindrical capacitive elements are formed in a first via layer and a second metal layer, and second cylindrical capacitive elements are formed in a second via layer and a third metal layer stacked on the first cylindrical capacitive elements for increased capacitance density.

FIG. 1 is an illustration of a perspective view of a MIMCAP 100 that provides a high capacitance density on a substrate 102 by employing a plurality of center studs 104 disposed in cavities 106 of a top plate 108. The center studs 104 have stud side walls 110 that are orthogonal to a first metal layer 112 (Z-axis direction), which may be referred to herein as being "vertical" but is not intended to be limited to a particular spatial orientation except with respect to the first metal layer 112 (which extends in the X-axis and Y-axis directions). Having vertical stud side walls 110 reduces the area used in the first metal layer 112 to provide a given amount of capacitance. In particular, as shown in the example in FIG. 1, center studs 104 may be cylindrical and correspond to cavity walls 114 in the cavities 106, which are also cylindrical to increase density of capacitive plate area.

Here, the center studs 104 have a first end 116 on a first surface 118 of bottom plates 122A, 122B in the first metal layer 112, and a second end 120 opposite to the first end 116. The bottom plates 122A, 122B in this example are metal interconnects 124 formed in metal tracks 126 of the first metal layer 112. Thus, the first surface 118 of the bottom plates 122A, 122B is also the first surface 118 of the first metal layer 112. A center-to-center distance $D_Y$ in the Y-axis direction between center studs 104 on different bottom plates 122A, 122B corresponds to a track pitch $P_{126}$ of the metal tracks 126. The bottom plates 122A, 122B can be electrically coupled to each other to include the center studs 104 on the bottom plate 122A and the center studs 104 on the bottom plate 122B in a same MIMCAP 100. Alternatively, the bottom plates 122A, 122B could be electrically decoupled to form separate MIMCAPs 100. The center studs 104 extend orthogonal to the first surface 118, and in this regard, increasing the capacitance provided by the MIMCAP 100 does not increase the area occupied in the first metal layer 112. Rather, the capacitance increases with the height $H_{104}$ (in the Z-axis direction) of the center studs 104 and the corresponding cavity walls 114. The center studs 104 extend from the first surface 118 of the bottom plate 122A, 122B through a first via layer 128 and also through a second metal layer 130. In this regard, the center studs 104 include a via layer stud 132 in the first via layer 128 and a metal layer stud 134 in the second metal layer 130. The first metal layer 112, the first via layer 128, and the second metal layer 130 are consecutive layers on the substrate 102 in FIG. 1 but may be any consecutive layers formed on the substrate 102, and FIG. 1 should not be construed to limit the location of the MIMCAP 100 in this regard.

The top plate 108 is also formed in the first via layer 128 and the second metal layer 130. The top plate 108 is formed of a metal 136 that includes cavities 106 in which the center studs 104 are disposed. The cavities 106 are voids in the metal 136 and are shaped according to the center studs 104. The cavity walls 114 are the inside surfaces of the cavities 106 that extend around the stud side walls 110 of each of the center studs 104 in the first via layer 128 and in the second metal layer 130. The cavity walls 114 are separated from the stud side walls 110 by a dielectric layer 138 disposed between the cavity walls 114 of each of the cavities 106 in the top plate 108 and the stud side walls 110 of the center studs 104. The cavities 106 do not include a surface corresponding to the second ends 120 of the center studs 104. Capacitance is developed between the stud side walls 110 and the cavity walls 114 when there is a voltage difference between the top plate 108 and the center studs 104, which are electrically coupled to each other by the bottom plates 122A, 122B, in this example. In this regard, the bottom plates 122A and 122B may comprise a first electrode 140 of the MIMCAP 100, and the top plate 108 may comprise a second electrode 142. In an alternative example, the MIMCAP may not include the bottom plates 122A and 122B, and the plurality of center studs 104 may be coupled together in a different manner (not shown) such that all the center studs 104 are electrically coupled to a same voltage.

Figure 2:
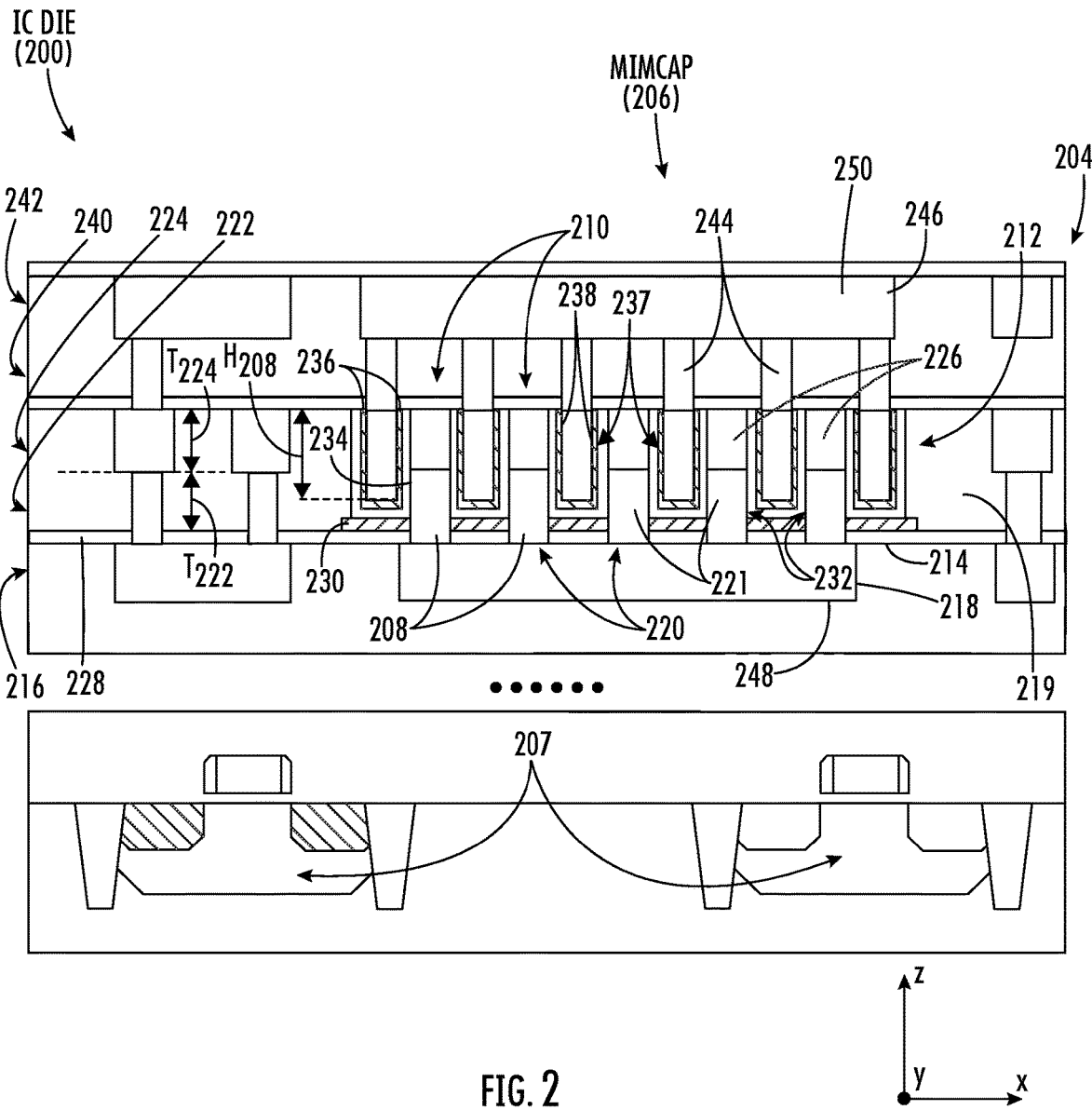
FIG. 2 is a cross-sectional side view, corresponding to a cross-section taken at line A-A' in FIG. 1, of a semiconductor die, including transistors, and overlying interconnect layers including a two-electrode MIMCAPs formed of center studs disposed in a plurality of cavities of a top plate.

FIG. 1 is a simplified illustration provided for purposes of explanation and to provide a 3D perspective to assist with an understanding of the two-dimensional (2D) view in FIG. 2. FIG. 2 is a cross-sectional side view of an IC die 200, including a substrate 202 and interconnect layers 204 in which a MIMCAP 206 is formed. The view of the interconnect layers 204 in FIG. 2 corresponds to a cross-section taken at line A-A' through the MIMCAP 100 in FIG. 1. The substrate 202 is separate from the interconnect layers 204 to show that the MIMCAP 206 may be formed in any consecutive interconnect layers 204. The substrate 202 may include any number of transistors 207 for use in a radio frequency (RF) circuit to which the MIMCAP 206 may also be coupled. Although the MIMCAP 206 generally corresponds to the MIMCAP 100 in FIG. 1, the cross-sectional view of FIG. 2 includes additional details not visible in the perspective view of FIG. 1.

The MIMCAP 206 includes a plurality of center studs 208 disposed in cavities 210 of a top plate 212. The center studs 208 are orthogonal to a first surface 214 of a first metal layer 216, which includes a bottom plate 218. Forming features such as the bottom plate 218 and the center studs 208 includes a process of forming an inter-metal dielectric (IMD) 219, trenching or etching patterns in the IMD 219, and depositing metal (e.g., copper). In this example, a bottom stud end 220 of each of the center studs 208 is disposed on the bottom plate 218 to electrically couple all of the center studs 208. The center studs 208 extend orthogonal to the first surface 214 as via layer studs 221 in the first via layer 222. The center studs 208 continue through a second metal layer 224 as metal layer studs 226 stacked on top of the via layer studs 221. The center studs 208 may have a height $H_{208}$ in the Z-axis direction corresponding to the thicknesses $T_{222}$ (e.g., 1000 nanometers) of the first via layer and thickness $T_{224}$ of the second metal layer 224. The height $H_{208}$ of the center studs 208 is one of the factors in determining a total capacitance of the MIMCAP 206. Thus, forming the center studs 208 of both the via layer studs 221 and the metal layer studs 226 increases the total capacitance and the capacitance density of the MIMCAP 206 compared to forming capacitive elements in only the first via layer 222, for example.

On the first surface 214 of the first metal layer 216, a diffusion barrier layer 228 such as, for example, silicon carbon nitride (SiCN) is disposed around the center studs 208 to reduce or avoid diffusion of atoms from the first metal layer 216 into the IMD layer 219. The first metal layer 216 is a conductive metal and may be copper, which can diffuse if not treated with a diffusion barrier. On the diffusion barrier layer 228, an etch stop layer 230 is disposed around the center studs 208 for reasons pertaining to fabrication, as explained below. The etch stop layer 230 in this example is silicon nitride (SiN) but is not limited in this regard. The diffusion barrier layer 228 and the etch stop layer 230 are disposed on the first surface 214 between stud side walls 232 of adjacent center studs 208.

The center studs 208 are formed of a conductive metal, such as copper, which can diffuse through other materials if not constrained. Thus, a diffusion barrier layer 234, such as titanium nitride (TiN) and/or tantalum nitride (TaN), is provided on the center studs 208 and also on the etch stop layer 230. A dielectric layer 236 is formed on the diffusion barrier layer 234 on the stud side walls 232 and also on the etch stop layer 230. The top plate 212 comprises metal, such as copper, deposited on the dielectric layer 236 to fill space between the stud sides walls 232 of the respective center studs 208 in the first via layer 222 and the second metal layer 224. Cavity walls 237 are formed where the top plate 212 is closest to the dielectric layer 236. Since the top plate 212 is also a conductive metal and may be copper, a diffusion barrier layer 238 is disposed between the dielectric layer 236 and the top plate 212. A second via layer 240 and a third metal layer 242 are also shown in FIG. 2. The top plate 212 is coupled, through multiple vias 244 in the second via layer 240, to a metal interconnect 246 in the third metal layer 242. The bottom plate 218 may be a first electrode 248 for the MIMCAP 206, and the metal interconnect 246 may be a second electrode 250. The capacitance of the MIMCAP 206 can be doubled by duplicating the structures of the MIMCAP 206 (e.g., the top plate 212, the dielectric layer 236, and the center studs 208) in the second via layer 240 and the third metal layer 242. In this manner, the center studs 208 can extend from the first via layer 222 up to and through the third metal layer 242, and the top plate 212 can be coupled to the duplicate top plate for parallel connection of the MIMCAP 206 and the duplicate. In such a case, the vias 244 can be formed in a third via layer (not shown).

FIG. 3 is a flow chart illustrating a method 300 for fabricating the MIMCAP 206 in FIG. 2. The method 300 includes forming a plurality of center studs (208), each center stud (208) of the plurality of center studs (208) comprising stud side walls (232) orthogonal to a first surface (214) of a first metal layer (216) and extending through a first via layer (222) and a second metal layer (224)(block 302). The method includes forming a top plate (212) comprising a plurality of cavities (210), each comprising cavity walls (237) surrounding the stud side walls (232) of each center stud (208) of the plurality of center studs (208) (block 304). The method further includes forming a dielectric layer (236) between the cavity walls (237) of each cavity (210) of the plurality of cavities (210) in the top plate (212) and the stud side walls (232) of corresponding center studs (208) of the plurality of center studs (208) (block 306).

Figure 4:
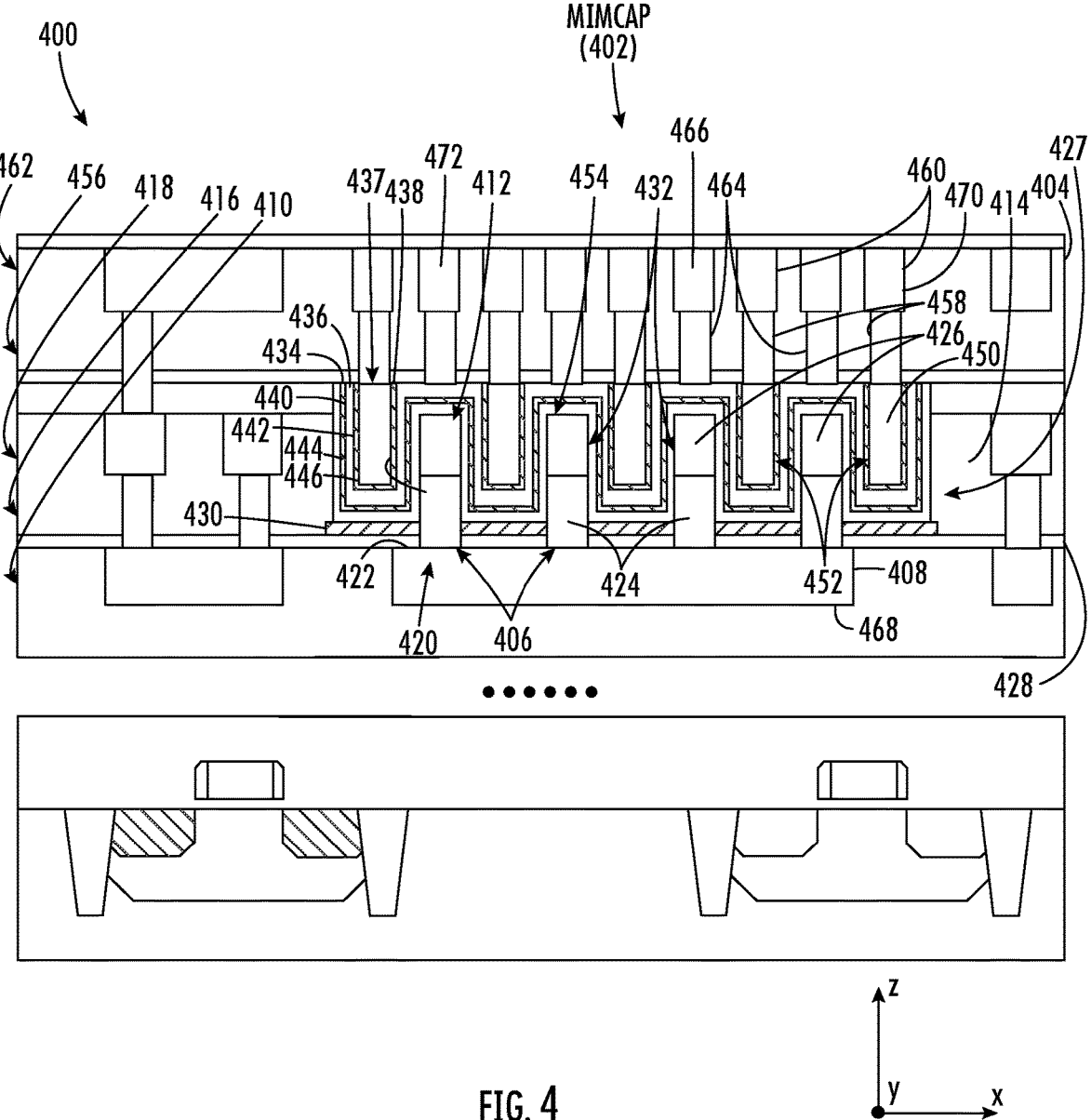
FIG. 4 is a cross-sectional side view of a semiconductor die and overlying interconnect layers, including a three-electrode MIMCAP formed of center studs disposed in a plurality of cavities of a top plate.

The MIMCAP 206 in FIG. 2 is an example of a two-electrode MIMCAP according to the exemplary aspects disclosed herein. In another example, an IC die 400 includes a three-electrode MIMCAP 402 formed according to the disclosed exemplary aspects, as illustrated in FIG. 4. The MIMCAP 402 in FIG. 4 is similar in many regards to the MIMCAP 206 in FIG. 2. The MIMCAP 402 is formed in interconnect layers 404, in a consecutive set of the interconnect layers 404 (e.g., $M_X$, $V_X$, $M_{X+1}$, $V_{X+1}$, $M_{X+2}$). Common aspects are identified, and differences between the MIMCAP 206 and the MIMCAP 402 are described in more detail.

The MIMCAP 402 includes center studs 406 disposed on a bottom plate 408 in a first metal layer 410. As described further below, the center studs 406 are formed in trenches 412 in inter-metal dielectric (IMD) layers 414 in a first via layer 416 and a second metal layer 418. The center studs 406 extend through the first via layer 416 from a bottom stud end 420, orthogonal to a first surface 422 of the bottom plate 408. In the first via layer 416, the center studs 406 include via layer studs 424. Extending in the second metal layer 418, the center studs 406 include metal layer studs 426 stacked on the via layer studs 424. The IMD layer 414 is etched around the center studs 406 in the first via layer 416 and the second metal layer 418 for formation of a top plate 427. A diffusion barrier 428 (e.g., SiCN) is formed on the first surface 422, and an etch stop layer 430 (e.g., SiN) is formed on the diffusion barrier 428 around the center studs 406 (between stud side walls 432 of respective center studs 406). A first dielectric layer 434 (e.g., SiN or high-k dielectric film (HfOx, ZnOx)) is formed (e.g., deposited) over the diffusion barrier 428 on the stud side walls 432 and on the etch stop layer 430 between the center studs 406. A conformal metal layer 436 and a second dielectric layer 438 are formed over the first dielectric layer 434. The conformal metal layer 436 is formed on the stud side walls 432 and on a top stud end 437 of the center studs 406, which is opposite to the bottom stud end 419. The second dielectric layer 438 is formed on the stud side walls 432 but not on the top stud ends 437 of the center studs 406, leaving the conformal metal layer 436 exposed on the top stud ends 437. To avoid molecular diffusion of the conformal metal layer 436 into the first dielectric layer 434 and the second dielectric layer 438, a diffusion barrier 440 is included between the first dielectric layer 434 and the conformal metal layer 436, and another diffusion barrier 442 is included between the conformal metal layer 436 and the second dielectric layer 438. Depositing the conformal metal layer 436 may also include depositing a seed layer 444 (e.g., copper) on the diffusion barrier 440 before depositing the conformal metal layer 436. The diffusion barriers 440, 442 can be TiN. Another diffusion barrier 446 and a seed layer 448 are formed on the second dielectric layer 438 so that space between the stud side walls 432 can be filled with a metal 450 to form the top plate 427. Cavity walls 452 of cavities 454 of the top plate 427 are formed around the center studs 406 by the metal 450 that is disposed around the center studs 406 against the diffusion barrier 446 (i.e., on the stud side walls 432).

In a second via layer 456, first vias 458 couple the top plate 427 to metal interconnects 460 in a third metal layer 462, and second vias 464 couple the conformal metal layer 436 to metal interconnects 466 in the third metal layer 462. In this regard, the bottom plate 408 provides a first electrode 468, the metal interconnects 460 provide a second electrode 470, and the metal interconnects 466 provide a third electrode 472.

The 3D MIMCAP 402 may be fabricated by a method 500 illustrated in the flow chart in FIG. 5. The method forming a bottom plate (408) in a first metal layer (410), the bottom plate (408) comprising a first surface (422) (block 502). The method further includes forming a plurality of center studs (406) extending from the first surface (422) of the bottom plate (408) through a first via layer (416) and a second metal layer (418), the plurality of center studs comprising stud side walls (432) orthogonal to the first surface (422) of the bottom plate (408), a bottom stud end (419) on the first surface (422) of the bottom plate (408), and a top stud end (437) opposite to the bottom stud end (419) (block 504). The method includes forming a top plate (427) comprising a plurality of cavities (454) comprising cavity walls (452) surrounding the stud side walls (432) of the plurality of center studs (406) (block 506). The method includes forming a conformal metal layer (436) between the cavity walls (452) of the cavities (454) of the top plate (427) and the stud side walls (432) of the center studs (406) and disposed on the top stud ends (437) of the plurality of center studs (406) (block 508). The method includes forming a first dielectric layer (434) between the conformal metal layer (436) and the center studs (406) on the stud side walls (432) and the top stud ends (437) (block 510). The method further includes forming a second dielectric layer (438) between the conformal metal layer (436) and the cavity walls (452) of the cavities (454) in the top plate (437) (block 512).

Figure 6:
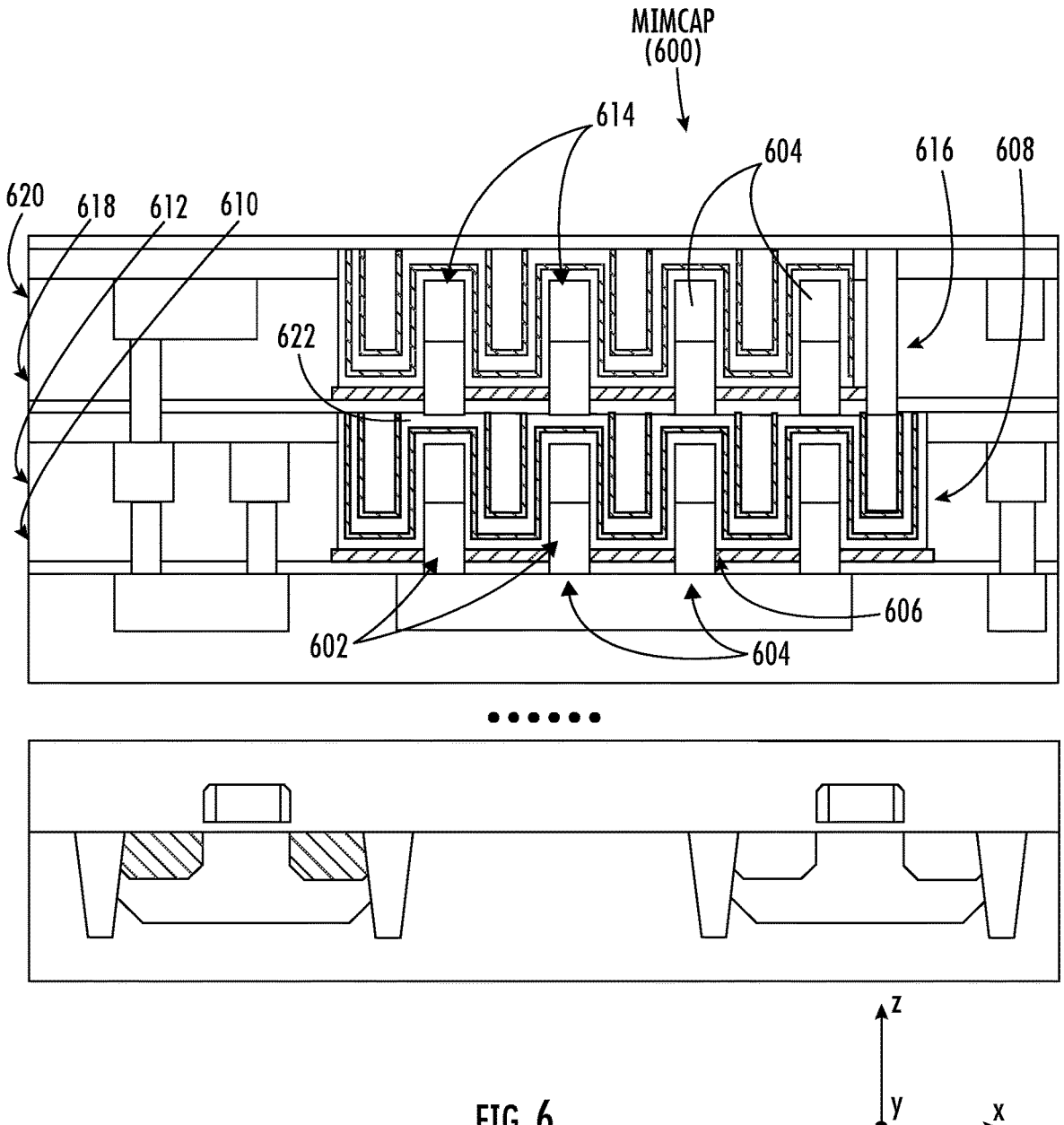
FIG. 6 is a cross-sectional side view of a semiconductor die and overlying interconnect layers, including a first plurality of center studs disposed in a first top plate in a first via layer and a second metal layer and a second plurality of center studs disposed in a second top plate in a second via layer and a third metal layer.

The center studs 406 and the top plate 437 in the 3D MIMCAP 402 in FIG. 4 are formed within the first via layer 416 and the second metal layer 418. Without increasing the area (in the X-axis, Y-axis plane), more capacitance, and thus a greater capacitance density, can be achieved by vertical stacking. In particular, as shown in FIG. 6, a 3D MIMCAP 600 can include a first plurality of capacitive elements 602, each including a center stud 604 disposed in a cavity 606 of a top plate 608 in a first via layer 610 and a second metal layer 612, and also include a second plurality of capacitive elements 614, each including a center stud 604 disposed in a cavity 606 of a top plate 616 in a second via layer 618 and a second metal layer 620. As shown in FIG. 6, the center studs 604 of the second plurality of capacitive elements 614 are coupled to a conformal metal layer 622 of the first plurality of capacitive elements 602.

In the above manner, the total capacitance of the 3D MIMCAP 600 in FIG. 6 is twice the capacitance of the MIMCAP 402 in FIG. 4 in a same amount of area, which corresponds to doubling the capacitance density. The capacitance density of the MIMCAP 600 may be further doubled (not shown here) in the same manner by forming a third plurality of capacitive elements in a third via layer and a fourth metal layer, and a fourth plurality of capacitive elements in a fourth via layer and a fifth via layer.

FIGS. 7A-7E are cross-sectional side views illustrating a MIMCAP 700 in stages 700A-700E of fabrication according to a fabrication process 800 illustrated in a flow chart in corresponding FIGS. 8A-8E. The MIMCAP 700 corresponds to the MIMCAP 206 in FIG. 2.

Figures 7A, 8A:
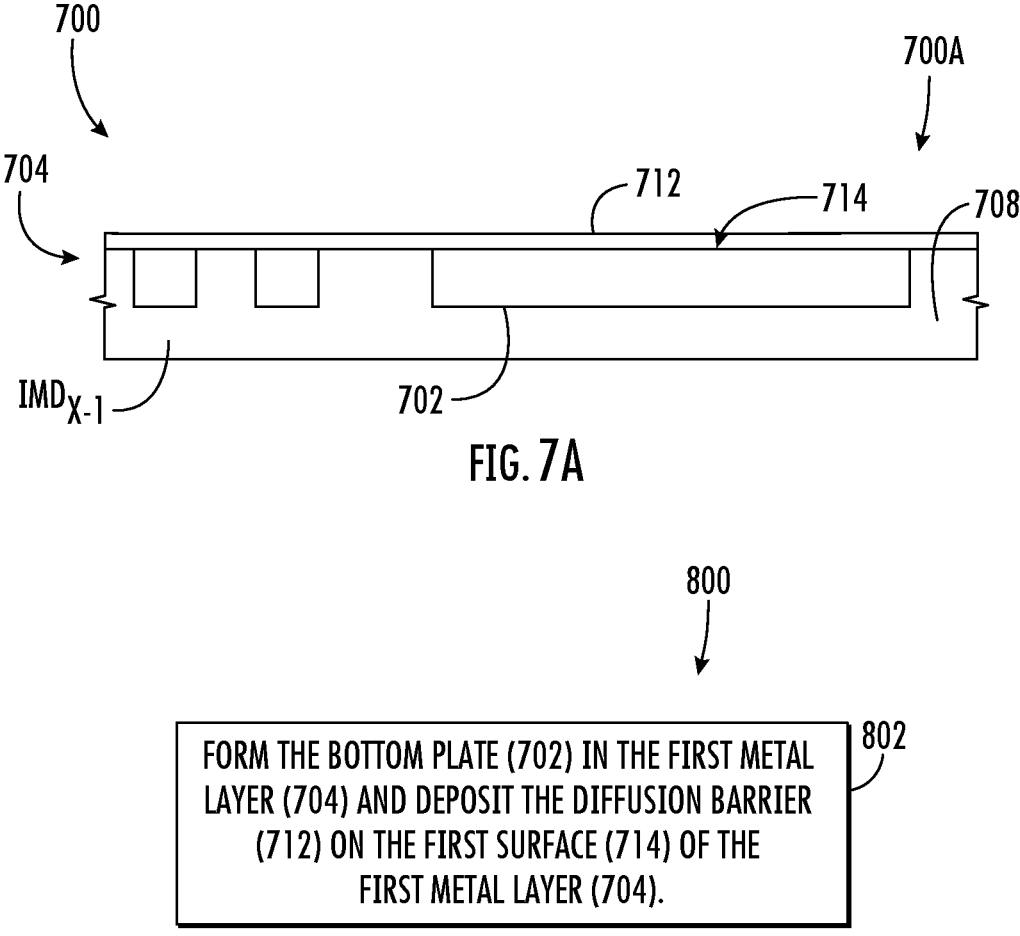

FIG. 7A is a cross-sectional side view of the MIMCAP 700 in stage 700A, which shows an IMD layer $IMD_{X-1}$ in which a bottom plate 702 is formed in a first metal layer 704. The IMD layer $IMD_{X-1}$ may be any layer above a semiconductor substrate 708. A diffusion barrier 712 comprising, for example, SiCN, is deposited on a first surface 714 of the first metal layer 704. The method 800 in FIG. 8A includes forming the bottom plate (702) in the first metal layer (704) and depositing the diffusion barrier (712) on the first surface (714) of the first metal layer (704) (block 802).

Figures 7B, 8B:
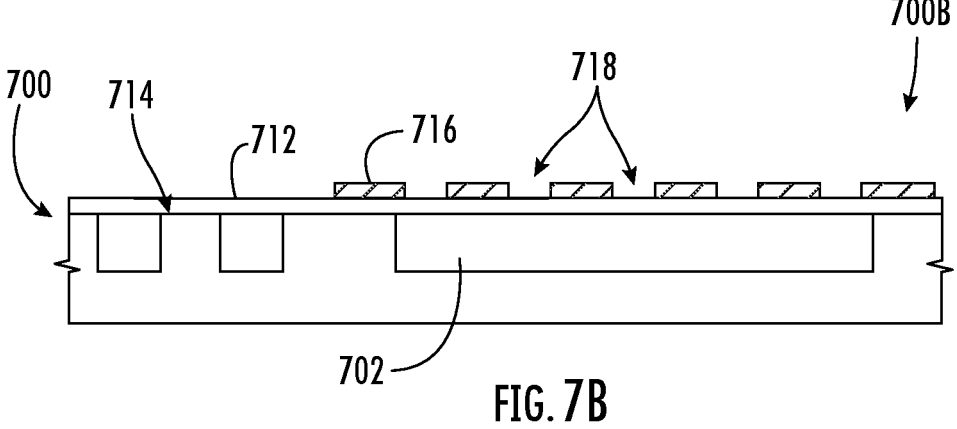

FIG. 7B is a cross-sectional side view of the MIMCAP 700 in stage 700B showing a patterned etch stop layer (716) (e.g., SiN) formed on the diffusion barrier 712 and including openings 718 where bottom stud ends of center studs (see FIG. 7C) will be formed on the first surface 714 of the bottom plate 702. The method in FIG. 8B includes depositing the etch stop layer (716) on the diffusion barrier (712)

and patterning the etch stop layer (716) to create the openings (718) for the bottom stud ends (block 804)

Figures 7C, 8C:
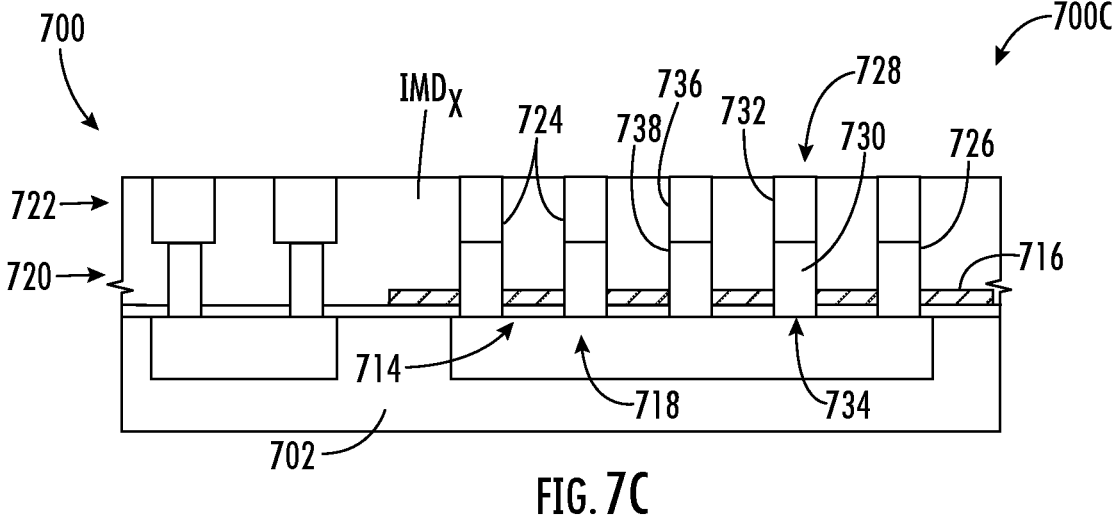

FIG. 7C is a cross-sectional side view of the MIMCAP 700 in stage 700C showing a next IMD layer $IMD_X$ deposited over the MIMCAP 700 shown in stage 700B. A first via layer 720 and a second metal layer 722 can be formed in the IMD layer $IMD_X$. Employing a dual damascene process, trenches 724 are formed through the IMD layer $IMD_X$ to the openings 718 in the etch stop layer 716, and metal 726 (e.g., copper) is deposited into the trenches 724 to form center studs 728, including a via layer stud 730 in the first via layer 720, and a metal layer stud 732 in the second metal layer 722. A bottom stud end 734 is disposed on the first surface 714 through the openings 718. However, to avoid diffusion of the metal 726 into the IMD layer $IMD_X$, a barrier metal 736 (e.g., TiN/TaN) is deposited on the IMD layer $IMD_X$ in the trenches 724. Next, to improve adhesion, a seed layer 738 (e.g., of copper) is deposited on the barrier metal 736. The metal 726 may be deposited by a plating process.

The method in FIG. 8C includes forming the IMD layer $IMD_X$, trenching the IMD layer $IMD_X$ to the openings (718), forming the barrier metal (736) on the IMD layer $IMD_X$ in the trenches (724), forming the seed layer (738) on the barrier metal (736), and forming center studs (728) on the seed layer (738) in the trenches (724) (block 806).

FIG. 7D is a cross-sectional side view of the MIMCAP 700 in stage 700D showing a top plate 740 formed around the center studs 728, creating cavities 742 in the metal 744 of the top plate 740. FIG. 7C also shows a dielectric layer 746 disposed between cavity walls 748 of the top plate 740 and stud side walls 750 of the center studs 728. A barrier metal 752 is disposed on the stud side walls 750 of the center studs 728 before the dielectric layer 746 is formed. Another barrier metal 754 and seed layer 756 are formed on the dielectric layer 746 before the metal 744 is deposited for the top plate 740.

The method in FIG. 8D includes etching the IMD layer $IMD_X$ in the first via layer (720) and the second metal layer (722). FIG. 8D further includes depositing the barrier metal (752) on the stud side walls (750) of the center studs (728), forming the dielectric layer (746) (e.g., TiN), and forming the barrier metal (754) on the dielectric layer (742). FIG. 8D further includes depositing the seed layer (756) on the barrier metal (754) and forming (e.g., by plating) the metal (744) of the top plate (740) in between the stud side walls (750) of the center studs (728). FIG. 8D further includes a CMP to remove unwanted layers on top of the IMD layer $IMD_X$(block 808).

Figures 7E, 8E:
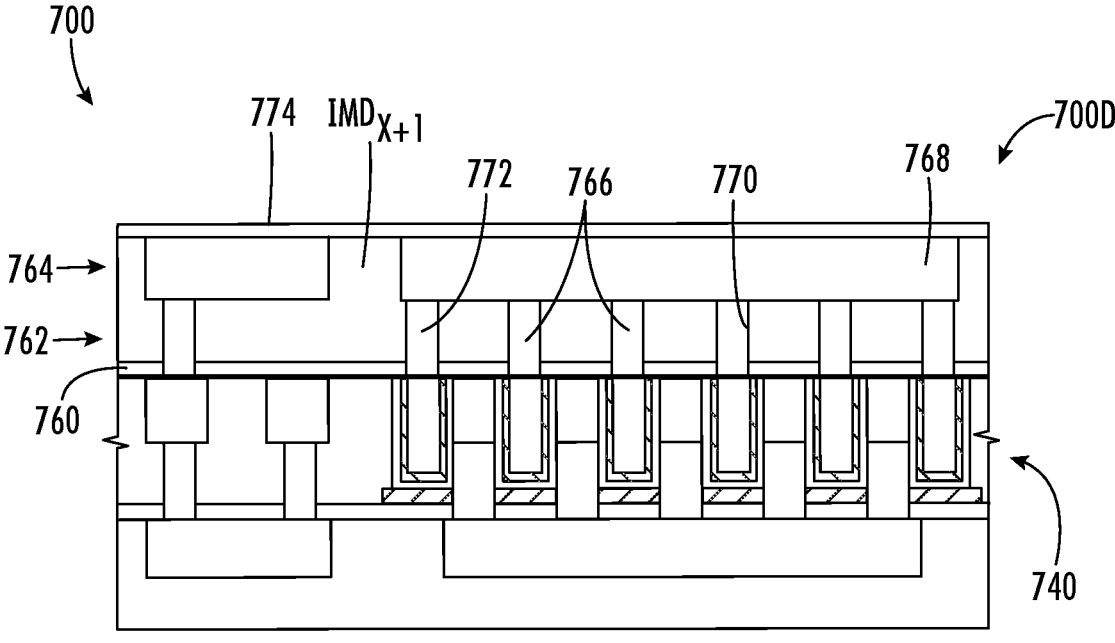

FIG. 7E is a cross-sectional side view of the MIMCAP 700 in stage 700E showing another IMD layer $IMD_{X+1}$ separated from the IMD layer $IMD_X$ by a diffusion barrier 760. A second via layer 762 and a third metal layer 764 are formed in the IMD layer $IMD_{X+1}$. Vias 766 in the second via layer 762 couple the top plate 740 to a metal interconnect 768 in the third metal layer 764. Barrier metal 770 on the IMD layer $IMD_X$ reduces diffusion of the metal 772 of the top plate 740.

The method in FIG. 8E includes depositing a diffusion barrier (760) and depositing the IMD layer $IMD_{X+1}$. The method includes etching the IMD layer $IMD_{X+1}$ in the second via layer (762) for the vias 766 and in the third metal layer (764) for the metal interconnect (768). The dual damascene process includes depositing barrier metal (770) on the IMD layer $IMD_{X+1}$ before adding metal (772) to form the vias (766) and the metal interconnect (768). The method further includes depositing a top diffusion barrier (774) (SiCN) (block 810).

Figure 9:
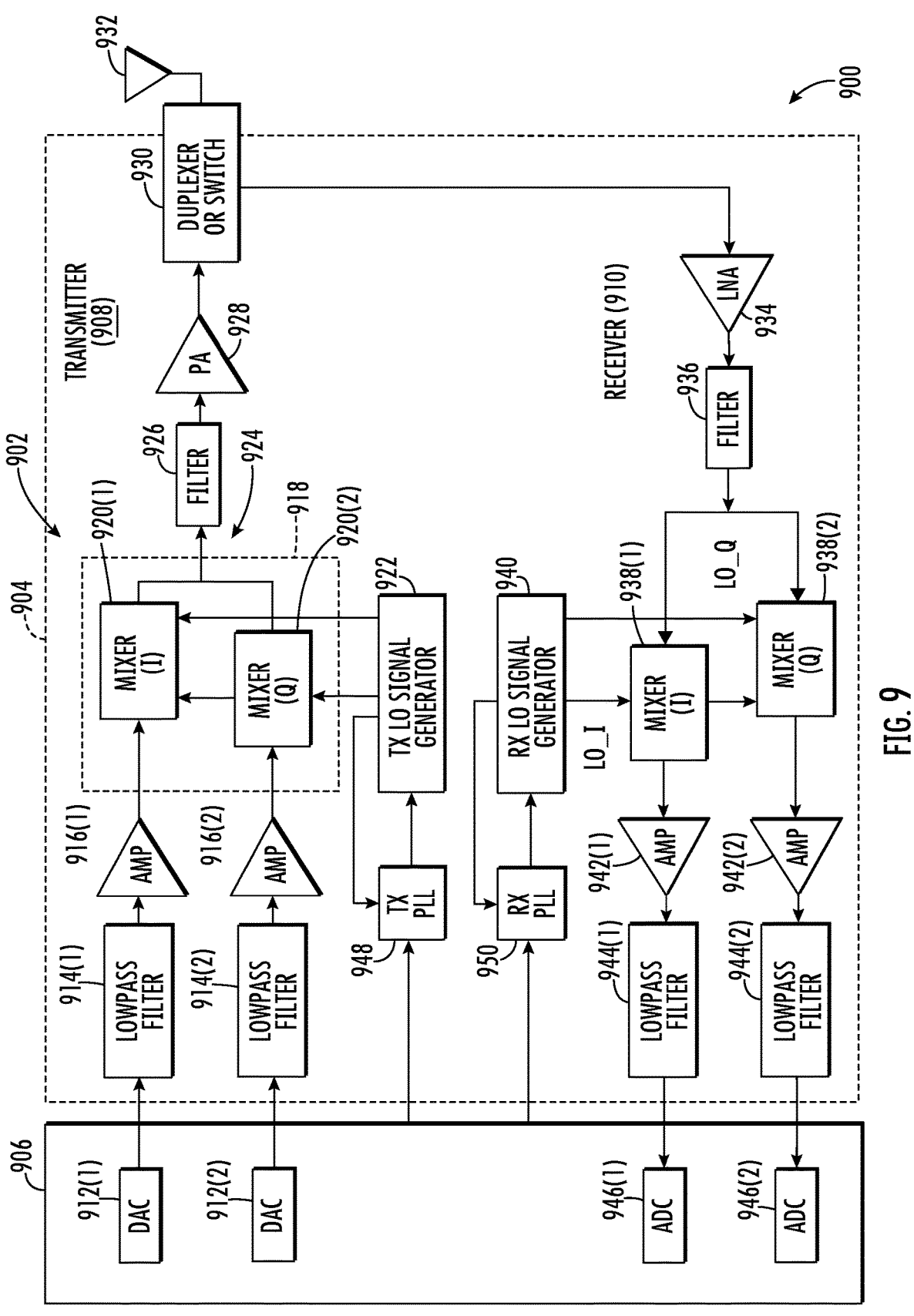
FIG. 9 is a block diagram of an exemplary wireless communications device that includes an integrated circuit (IC) including a MIMCAP formed in the interconnect layers, including center studs orthogonal to a first metal layer disposed in cavities of a top plate in a first via layer and a second metal layer to provide high capacitance density, as illustrated in FIGS. 1, 2, 4, and 6.

FIG. 9 illustrates an exemplary wireless communications device 900 that includes RF components formed from one or more ICs 902 and can include a MIMCAP formed in the interconnect layers including center studs orthogonal to a first metal layer disposed in cavities of a top plate in a first via layer and a second metal layer to provide high capacitance density, as illustrated in FIGS. 1, 2, 4, and 6, and according to any of the aspects disclosed herein. The wireless communications device 900 may include or be provided in any of the above-referenced devices, as examples. As shown in FIG. 9, the wireless communications device 900 includes a transceiver 904 and a data processor 906. The data processor 906 may include a memory to store data and program codes. The transceiver 904 includes a transmitter 908 and a receiver 910 that support bi-directional communications. In general, the wireless communications device 900 may include any number of transmitters 908 and/or receivers 910 for any number of communication systems and frequency bands. All or a portion of the transceiver 904 may be implemented on one or more analog ICs, RFICs, mixed-signal ICs, etc.

The transmitter 908 or the receiver 910 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the exemplary wireless communications device 900, the data processor 906 includes digital-to-analog converters (DACs) 912(1), 912(2) for converting digital signals generated by the data processor 906 into the I and Q analog output signals, e.g., I and Q output currents, for further processing.

Within the transmitter 908, lowpass filters 914(1), 914(2) filter the I and Q analog output signals, respectively, to remove undesired signals caused by the prior digital-to-analog conversion. Amplifiers (AMPs) 916(1),916(2) amplify the signals from the lowpass filters 914(1), 914(2), respectively, and provide I and Q baseband signals. An upconverter 918 upconverts the I and Q baseband signals with I and Q transmit (TX) local oscillator (LO) signals from a TX LO signal generator 922 through mixers 920(1), 920(2) to provide an upconverted signal 924. A filter 926 filters the upconverted signal 924 to remove undesired signals caused by the frequency upconversion as well as noise in a receive frequency band. A power amplifier (PA) 928 amplifies the upconverted signal 924 from the filter 926 to obtain the desired output power level and provides a transmit RF signal. The transmit RF signal is routed through a duplexer or switch 930 and transmitted via an antenna 932.

In the receive path, the antenna 932 receives signals transmitted by base stations and provides a received RF signal, which is routed through the duplexer or switch 930 and provided to a low noise amplifier (LNA) 934. The duplexer or switch 930 is designed to operate with a specific receive (RX)-to-TX duplexer frequency separation, such that RX signals are isolated from TX signals. The received RF signal is amplified by the LNA 934 and filtered by a filter

936 to obtain a desired RF input signal. Downconversion mixers 938(1), 938(2) mix the output of the filter 936 with I and Q RX LO signals (i.e., LO_I and LO_Q) from an RX LO signal generator 940 to generate I and Q baseband signals. The I and Q baseband signals are amplified by AMPs 942(1), 942(2) and further filtered by lowpass filters 944(1), 944(2) to obtain I and Q analog input signals, which are provided to the data processor 906. In this example, the data processor 906 includes analog-to-digital converters (ADCs) 946(1), 946(2) for converting the analog input signals into digital signals to be further processed by the data processor 906.

In the wireless communications device 900 of FIG. 9, the TX LO signal generator 922 generates the I and Q TX LO signals used for frequency upconversion, while the RX LO signal generator 940 generates the I and Q RX LO signals used for frequency downconversion. Each LO signal is a periodic signal with a particular fundamental frequency. A TX phase-locked loop (PLL) circuit 948 receives timing information from the data processor 906 and generates a control signal used to adjust the frequency and/or phase of the TX LO signals from the TX LO signal generator 922. Similarly, an RX PLL circuit 950 receives timing information from the data processor 906 and generates a control signal used to adjust the frequency and/or phase of the RX LO signals from the RX LO signal generator 940.

Wireless communications devices 900 that can each include an IC including a MIMCAP formed in the interconnect layers including center studs orthogonal to a first metal layer disposed in cavities of a top plate in a first via layer and a second metal layer to provide high capacitance density, as illustrated in FIGS. 1, 2, 4, and 6, and according to any of the aspects disclosed herein, may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 10:
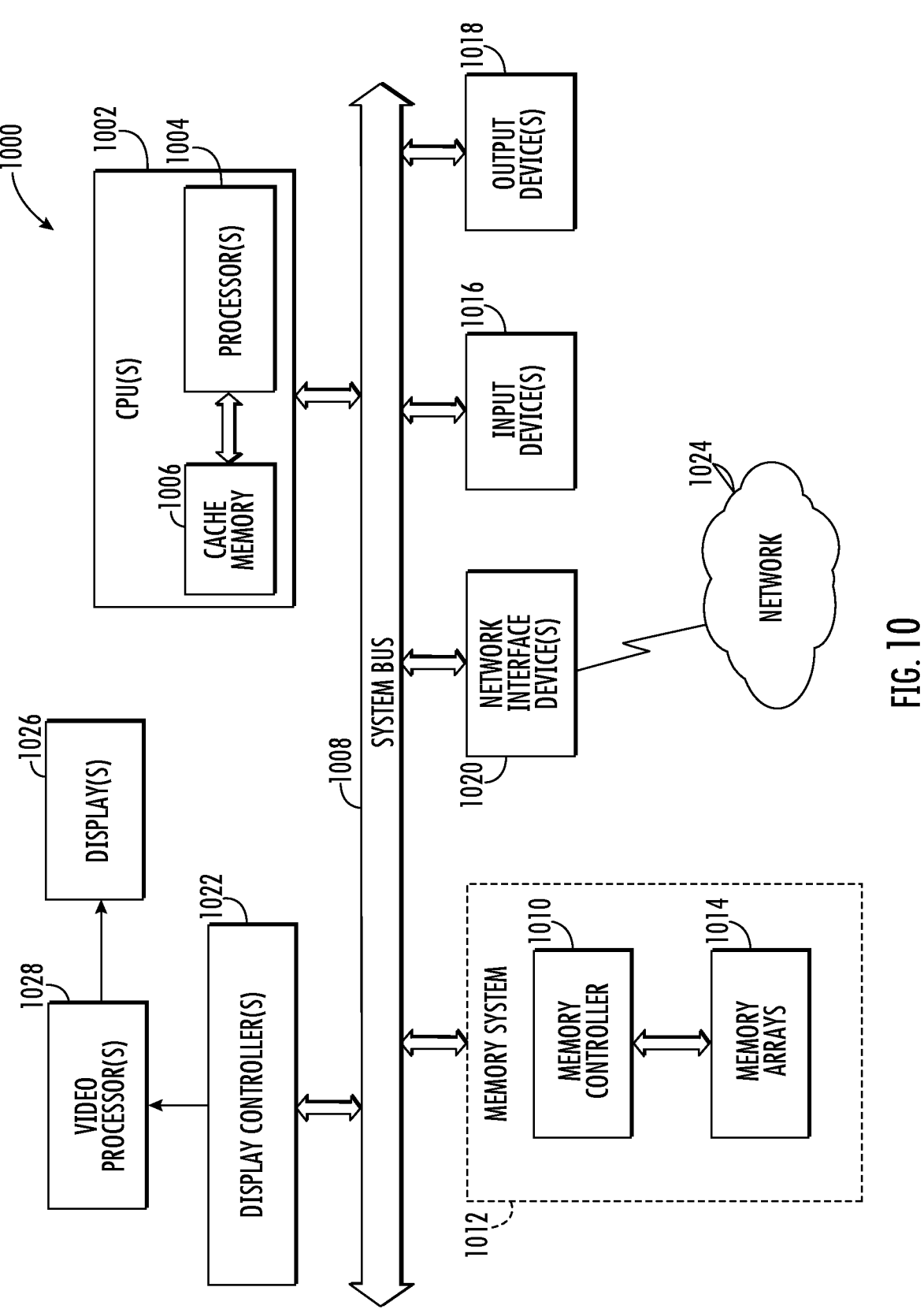
FIG. 10 is a block diagram of an exemplary processor-based system that can include an IC including a MIMCAP formed in the interconnect layers, including center studs orthogonal to a first metal layer disposed in cavities of a top plate in a first via layer and a second metal layer to provide high capacitance density, as illustrated in FIGS. 1, 2, 4, and 6, and according to any of the aspects disclosed herein.

In this regard, FIG. 10 illustrates an example of a processor-based system 1000 including an IC including a MIMCAP formed in the interconnect layers including center studs orthogonal to a first metal layer disposed in cavities of a top plate in a first via layer and a second metal layer to provide high capacitance density, as illustrated in FIGS. 1, 2, 4, and 10, and according to any aspects disclosed herein. In this example, the processor-based system 1000 includes one or more central processor units (CPUs) 1002, which may also be referred to as CPU or processor cores, each including one or more processors 1004. The CPU(s) 1002 may have cache memory 1006 coupled to the processor(s) 1004 for rapid access to temporarily stored data. The CPU(s) 1002 is coupled to a system bus 1008 and can intercouple master and slave devices included in the processor-based system 1000. As is well known, the CPU(s) 1002 communicates with these other devices by exchanging address, control, and data information over the system bus 1008. For example, the CPU(s) 1002 can communicate bus transaction requests to a memory controller 1010 as an example of a slave device. Although not illustrated in FIG. 10, multiple system buses 1008 could be provided, wherein each system bus 1008 constitutes a different fabric.

Other master and slave devices can be connected to the system bus 1008. As illustrated in FIG. 10, these devices can include a memory system 1012 that includes the memory controller 1010 and one or more memory arrays 1014, one or more input devices 1016, one or more output devices 1018, one or more network interface devices 1020, and one or more display controllers 1022, as examples. Any of the output devices 1018 and the network interface devices 1020 can include an IC including a MIMCAP formed in the interconnect layers, including center studs orthogonal to a first metal layer disposed in cavities of a top plate in a first via layer and a second metal layer to provide high capacitance density, as illustrated in FIGS. 1, 2, 4, and 10, and according to any of the aspects disclosed herein. The input device(s) 1016 can include any type of input device, including, but not limited to, input keys, switches, voice processors, etc. The output device(s) 1018 can include any type of output device, including, but not limited to, audio, video, other visual indicators, etc. The network interface device(s) 1020 can be any device configured to allow an exchange of data to and from a network 1024. The network 1024 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1020 can be configured to support any type of communications protocol desired.

The CPU(s) 1002 may also be configured to access the display controller(s) 1022 over the system bus 1008 to control information sent to one or more displays 1026. The display controller(s) 1022 sends information to the display(s) 1026 to be displayed via one or more video processors 1028, which process the information to be displayed into a format suitable for the display(s) 1026. The display(s) 1026 can include any type of display, including, but not limited to, a cathode ray tube (CRT), a liquid crystal display (LCD), a plasma display, a light-emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read-Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. A three-dimensional (3D) metal-insulator-metal (MIM) capacitor (MIMCAP), comprising:

a plurality of center studs, each center stud of the plurality of center studs comprising stud side walls orthogonal to a first surface of a first metal layer and extending through a first via layer and a second metal layer;

a top plate comprising a plurality of cavities, each cavity of the plurality of cavities comprising cavity walls surrounding the stud side walls of each center stud of the first plurality of center studs; and a dielectric layer disposed between the cavity walls of each cavity of the plurality of cavities of the top plate and the stud side walls of a corresponding center stud of the plurality of center studs.

2. The 3D MIMCAP of clause 1, wherein each center stud of the plurality of center studs comprises:

a via stud comprising metal in the first via layer, and a metal stud comprising metal in the second metal layer and stacked on the via stud.

3. The 3D MIMCAP of clause 1 or clause 2, wherein the top plate comprises metal extending around each center stud of the plurality of center studs.

4. The 3D MIMCAP of any of clause 1 to clause 3, further comprising a bottom plate comprising the first metal layer.

5. The 3D MIMCAP of any of clause 1 to clause 4, further comprising:

an etch stop layer disposed on the first surface of the first metal layer around the plurality of center studs, wherein the dielectric layer is further disposed on the etch stop layer.

6. The 3D MIMCAP of any of clause 1 to clause 5, further comprising:

first vias disposed in a second via layer on the second metal layer and coupling the plurality of center studs to a third metal layer; and second vias disposed in the second via layer and coupling the top plate to the third metal layer.

7. The 3D MIMCAP of any of clause 1 to clause 6, further comprising:

a second plurality of center studs in a second via layer and a third metal layer, and a second top plate in the second via layer and the third metal layer, wherein:

the plurality of center studs in the first via layer and the second metal layer is coupled to the second plurality of center studs; and the top plate in the first via layer and the second metal layer is coupled to the second top plate.

8. A method of fabricating a three-dimensional (3D) metal-insulator-metal (MIM) capacitor (MIMCAP), comprising:

forming a plurality of center studs, each center stud of the plurality of center studs comprising stud side walls orthogonal to a first surface of a first metal layer and extending through a first via layer and a second metal layer;

forming a top plate comprising a plurality of cavities, each cavity of the plurality of cavities comprising cavity walls surrounding the stud side walls of each center stud of the plurality of center studs; and forming a dielectric layer between the cavity walls of each cavity of the plurality of cavities of the top plate and the stud side walls of a corresponding center stud of the plurality of center studs.

9. The method of clause 8, wherein forming the plurality of center studs further comprises:

forming a diffusion barrier layer on the first surface of the first metal layer;

forming an etch stop layer on the diffusion barrier layer;

forming an inter-metal dielectric (IMD) in the first via layer and in the second metal layer;

forming trenches through the IMD; and depositing metal in the trenches in the first via layer and in the second metal layer.

10. The method of clause 9, wherein forming the dielectric layer further comprises:

removing the IMD around the plurality of center studs in the first via layer and in the second metal layer to the etch stop layer;

forming a barrier metal layer on the stud side walls of the plurality of center studs and on the etch stop layer, and depositing the dielectric layer on the barrier metal layer.

11. The method of clause 10, wherein forming the top plate further comprises:

forming a second barrier metal layer on the dielectric layer;

forming a seed layer on the second barrier metal layer; and depositing metal to fill between the stud side walls of the plurality of center studs in the first via layer and in the second metal layer.

12. A three-dimensional (3D) metal-insulator-metal (MIM) capacitor (MIMCAP), comprising:

a bottom plate in a first metal layer, the bottom plate comprising a first surface;

a plurality of center studs extending from the first surface of the bottom plate through a first via layer and a second metal layer, the plurality of center studs comprising:

stud side walls orthogonal to the first surface of the bottom plate;

bottom stud ends on the first surface of the bottom plate; and top stud ends opposite to the bottom stud ends;

a top plate comprising a plurality of cavities comprising cavity walls surrounding the stud side walls of the plurality of center studs;

a conformal metal layer between the cavity walls of the plurality of cavities of the top plate and the stud side walls of the plurality of center studs, and disposed on the top stud ends of the plurality of center studs;

a first dielectric layer disposed between the conformal metal layer and the plurality of center studs on the stud side walls and the top stud ends; and a second dielectric layer disposed between the conformal metal layer and the top plate.

13. The 3D MIMCAP of clause 12, further comprising:

first vias disposed in a second via layer on the second metal layer and coupling the conformal metal layer to a first metal interconnect in a third metal layer; and second vias disposed in the second via layer and coupling the top plate to a second metal interconnect in the third metal layer.

14. The 3D MIMCAP of clause 12 or clause 13, further comprising:

a second plurality of center studs in a second via layer and a third metal layer, each of the second plurality of center studs comprising:

stud side walls orthogonal to the first surface of the bottom plate;

a bottom stud end coupled to the conformal metal layer; and a top stud end opposite to the bottom stud end;

a second top plate comprising a second plurality of cavities comprising cavity walls surrounding the stud side walls of the second plurality of center studs; and a second conformal layer disposed between the cavity walls of the second plurality of cavities of the second top plate and the stud side walls of the second plurality of center studs and disposed on the top stud ends of the second plurality of center studs.

15. A method of forming a three-dimensional (3D) metal-insulator-metal (MIM) capacitor (MIMCAP), comprising:

forming a bottom plate in a first metal layer, the bottom plate comprising a first surface;

forming a plurality of center studs extending from the first surface of the bottom plate through a first via layer and a second metal layer, the plurality of center studs comprising:

stud side walls orthogonal to the first surface of the bottom plate;

bottom stud ends on the first surface of the bottom plate; and top stud ends opposite to the bottom stud ends;

forming a top plate comprising a plurality of cavities comprising cavity walls surrounding the stud side walls of the plurality of center studs;

forming a conformal metal layer between the cavity walls of the plurality of cavities of the top plate and the stud side walls of the plurality of center studs, and disposed on the top stud ends of the plurality of center studs;

forming a first dielectric layer between the conformal metal layer and the plurality of center studs on the stud side walls and the top stud ends; and forming a second dielectric layer between the conformal metal layer and the top plate.

16. The method of clause 15, wherein forming the plurality of center studs, further comprises:

forming a diffusion barrier layer on the first surface of the bottom plate;

forming a patterned etch stop layer comprising openings on the diffusion barrier layer;

forming an inter-metal dielectric (IMD) in the first via layer and in the second metal layer;

forming trenches through the IMD and through the diffusion barrier layer in the openings of the patterned etch stop layer; and depositing metal in the trenches in the first via layer and in the second metal layer.

17. The method of clause 16, wherein forming the first dielectric layer further comprises:

removing the IMD around the plurality of center studs in the first via layer and in the second metal layer to the patterned etch stop layer;

forming a barrier metal layer on the stud side walls of the plurality of center studs and on the etch stop layer; and depositing the first dielectric layer on the barrier metal layer.

18. The method of clause 17, wherein forming the conformal metal layer further comprises:

forming a second barrier metal layer on the first dielectric layer; and forming the conformal metal layer on the second barrier metal layer.

19. The method of clause 18, wherein forming the second dielectric layer further comprises:

forming a third barrier metal layer on the conformal metal layer on the stud side walls of the plurality of center studs; and forming the second dielectric layer on the third barrier metal layer.

20. The method of clause 19, wherein forming the top plate further comprises:

forming a fourth barrier metal layer on the second dielectric layer on the stud side walls of the plurality of center studs;

forming a seed layer on the fourth barrier metal layer; and depositing metal to fill between the stud side walls of the plurality of center studs in the first via layer and in the second metal layer.

What is claimed is:

1. A three-dimensional (3D) metal-insulator-metal (MIM) capacitor (MIMCAP), comprising:

a plurality of center studs, each center stud of the plurality of center studs comprising stud side walls orthogonal to a first surface of a first metal layer and extending through a first via layer and a second metal layer;

a top plate comprising a plurality of cavities, each cavity of the plurality of cavities comprising cavity walls continuously surrounding and concentric to the stud side walls of each center stud of the plurality of center studs; and a dielectric layer disposed between the cavity walls of each cavity of the plurality of cavities of the top plate and the stud side walls of a corresponding center stud of the plurality of center studs.

2. The 3D MIMCAP of claim 1, wherein each center stud of the plurality of center studs comprises:

a via stud comprising metal in the first via layer; and a metal stud comprising metal in the second metal layer and stacked on the via stud.

3. The 3D MIMCAP of claim 1, wherein the top plate comprises metal extending around each center stud of the plurality of center studs.

4. The 3D MIMCAP of claim 1, further comprising a bottom plate comprising the first metal layer.

5. The 3D MIMCAP of claim 4, wherein a first end of each of the plurality of center studs is in contact with a surface of the bottom plate.

6. The 3D MIMCAP of claim 1, further comprising:

an etch stop layer disposed on the first surface of the first metal layer around the plurality of center studs, wherein the dielectric layer is further disposed on the etch stop layer.

7. The 3D MIMCAP of claim 1, further comprising:

first vias disposed in a second via layer on the second metal layer and coupling the top plate to a third metal layer disposed on the second via layer.

8. The 3D MIMCAP of claim 1, further comprising a second plurality of center studs in a second via layer and a third metal layer; and a second top plate in the second via layer and the third metal layer;

wherein:

the plurality of center studs in the first via layer and the second metal layer is coupled to the second plurality of center studs; and the top plate in the first via layer and the second metal layer is coupled to the second top plate.

9. The 3D MIMCAP of claim 8, wherein the second via layer comprises a dielectric layer disposed between the second metal layer and the third metal layer in a direction orthogonal to the first surface of the first metal layer.

10. The 3D MIMCAP of claim 1, wherein the first via layer comprises a dielectric layer disposed between the first metal layer and the second metal layer.

11. The 3D MIMCAP of claim 1, wherein the top plate comprises a metal layer having a thickness corresponding to a height of each center stud of the plurality of center studs.

12. The 3D MIMCAP of claim 1, wherein each of the plurality of center studs is a solid cylindrical stud.

13. A method of fabricating a three-dimensional (3D) metal-insulator-metal (MIM) capacitor (MIMCAP), comprising:

forming a plurality of center studs, each center stud of the plurality of center studs comprising stud side walls orthogonal to a first surface of a first metal layer and extending through a first via layer and a second metal layer;

forming a top plate comprising a plurality of cavities, each cavity of the plurality of cavities comprising cavity walls continuously surrounding and concentric to the stud side walls of each center stud of the plurality of center studs; and forming a dielectric layer between the cavity walls of each cavity of the plurality of cavities of the top plate and the stud side walls of a corresponding center stud of the plurality of center studs.

14. The method of claim 13, wherein forming the plurality of center studs further comprises:

forming a diffusion barrier layer on the first surface of the first metal layer;

forming an etch stop layer on the diffusion barrier layer;

forming an inter-metal dielectric (IMD) in the first via layer and in the second metal layer;

forming trenches through the IMD; and depositing metal in the trenches in the first via layer and in the second metal layer.

15. The method of claim 14, wherein forming the dielectric layer further comprises:

removing the IMD around the plurality of center studs in the first via layer and in the second metal layer to the etch stop layer;

forming a barrier metal layer on the stud side walls of the plurality of center studs and on the etch stop layer; and depositing the dielectric layer on the barrier metal layer.

16. The method of claim 15, wherein forming the top plate further comprises:

forming a second barrier metal layer on the dielectric layer;

forming a seed layer on the second barrier metal layer; and depositing metal to fill between the stud side walls of the plurality of center studs in the first via layer and in the second metal layer.

17. A three-dimensional (3D) metal-insulator-metal (MIM) capacitor (MIMCAP), comprising:

a bottom plate in a first metal layer, the bottom plate comprising a first surface;

a plurality of center studs extending from the first surface of the bottom plate through a first via layer and a second metal layer, the plurality of center studs comprising:

stud side walls orthogonal to the first surface of the bottom plate;

bottom stud ends on the first surface of the bottom plate; and top stud ends opposite to the bottom stud ends;

a top plate comprising a plurality of cavities comprising cavity walls continuously surrounding and concentric to the stud side walls of the plurality of center studs;

a conformal metal layer between the cavity walls of the plurality of cavities of the top plate and the stud side walls of the plurality of center studs, and disposed on the top stud ends of the plurality of center studs;

a first dielectric layer disposed between the conformal metal layer and the plurality of center studs on the stud side walls and the top stud ends; and a second dielectric layer disposed between the conformal metal layer and the top plate.

18. The 3D MIMCAP of claim 17, further comprising:

first vias disposed in a second via layer on the second metal layer and coupling the conformal metal layer to a first metal interconnect in a third metal layer; and second vias disposed in the second via layer and coupling the top plate to a second metal interconnect in the third metal layer.

19. The 3D MIMCAP of claim 17, further comprising:

a second plurality of center studs in a second via layer and a third metal layer, each of the second plurality of center studs comprising:

stud side walls orthogonal to the first surface of the bottom plate;

a bottom stud end coupled to the conformal metal layer; and a top stud end opposite to the bottom stud end;

a second top plate comprising a second plurality of cavities comprising cavity walls surrounding the stud side walls of the second plurality of center studs; and a second conformal layer disposed between the cavity walls of the second plurality of cavities of the second top plate and the stud side walls of the second plurality of center studs and disposed on the top stud ends of the second plurality of center studs.

20. A method of forming a three-dimensional (3D) metal-insulator-metal (MIM) capacitor (MIMCAP), comprising:

forming a bottom plate in a first metal layer, the bottom plate comprising a first surface;

forming a plurality of center studs extending from the first surface of the bottom plate through a first via layer and a second metal layer, the plurality of center studs comprising:

stud side walls orthogonal to the first surface of the bottom plate;

bottom stud ends on the first surface of the bottom plate; and top stud ends opposite to the bottom stud ends;

forming a top plate comprising a plurality of cavities comprising cavity walls continuously surrounding and concentric to the stud side walls of the plurality of center studs;

forming a conformal metal layer between the cavity walls of the plurality of cavities of the top plate and the stud side walls of the plurality of center studs, and disposed on the top stud ends of the plurality of center studs;

forming a first dielectric layer between the conformal metal layer and the plurality of center studs on the stud side walls and the top stud ends; and forming a second dielectric layer between the conformal metal layer and the top plate.

* * * * *